United States Patent
Smits

(10) Patent No.: US 8,358,048 B2
(45) Date of Patent: Jan. 22, 2013

(54) HIGH SPEED OPTICAL SCANNING MIRROR SYSTEM USING PIEZOELECTRIC BENDERS

(75) Inventor: Johannes G. Smits, Middelburg (NL)

(73) Assignee: J. G. Smits, Middelburg (NL)

( * ) Notice: Subject to any disclaimer, the term of this patent is extended or adjusted under 35 U.S.C. 154(b) by 158 days.

(21) Appl. No.: 12/927,506

(22) Filed: Nov. 17, 2010

(65) Prior Publication Data

US 2012/0119619 A1    May 17, 2012

(51) Int. Cl.
*H10L 41/08* (2006.01)
(52) U.S. Cl. ............... 310/323.02; 310/330; 310/331
(58) Field of Classification Search .......... 310/330–332, 310/323.02
See application file for complete search history.

(56) References Cited

U.S. PATENT DOCUMENTS

| | | | | |
|---|---|---|---|---|
| 6,242,850 | B1 * | 6/2001 | Slutskiy et al. | 310/328 |
| 7,199,507 | B2 * | 4/2007 | Ganor et al. | 310/333 |
| 2010/0295418 | A1 * | 11/2010 | Blume et al. | 310/323.02 |
| 2011/0260580 | A1 * | 10/2011 | Blume et al. | 310/323.02 |

* cited by examiner

*Primary Examiner* — Mark Budd

(57) ABSTRACT

A construction is presented, which is comprised of two piezoelectric bending cantilevers, of different lengths, called a first bender and a second bender respectively, in which both benders bend in opposite directions. The second bender is mechanically in series connected to the first bender, thereby increasing the rotation angle of the tip of the second bender. The length of the second bender is chosen thus that in sinusoidal excitation, the tip of the second bender remains at the same point throughout the entire cycle, while it does undergo rotation. In this fashion a virtual axis at the tip of the second bender is created. The width of both benders is chosen such that the moment that the second bender can exert on an object that is connected to it, enables the construction to drive an optical element to scanning vibratory rotary motion with a large angle at high frequencies.

10 Claims, 2 Drawing Sheets

HIGH SPEED OPTICAL SCANNING MIRROR SYSTEM USING PIEZOELECTRIC BENDERS

STATEMENT REGARDING FEDERAL FUNDING FOR THIS INVENTION

No federal funding has been involved with the subject of this invention.

1 SUMMARY OF THE INVENTION

A piezoelectric bender driven rotational scanning unit is presented, which has a much higher scanning frequency than a normal piezoelectric bender driven device, due to its oversized piezoelectric bending motor units.

The latter are out of the domain of analytically accessible devices, as their dimensions exceed the limits for which analytical solutions to their governing differential equations are known.

The rotational scanning unit has a much higher scanning frequency as well as scanning angle for the same applied voltage than most of its competitors.

2 BACKGROUND OF THE INVENTION

In mechanical constructions, the movements of parts can broadly be classified into two categories: translation and rotation. In this application we concentrate on the rotation of an object. In many optical applications the redirection of light is a desired condition, such as in scanners, optical switches, in laser printers, bar code readers, projection TV, laser radar, imaging applications, and the like. Mirrors such as those in galvanometric mirror systems that can be rotated are typically fabricated using classical mechanical workshop techniques.

In certain applications the scanning speed is of importance, for instance in the case of certain medical laser imaging techniques, where a patient is subjected to a laser beam for imaging purpose, but where this laserbeam would cause harm to the patient if the dwelling time would be to long. In particular, in laser ophthalmology, when a laserbeam is used to scan over the retina, such a high speed scanner has advantages over a low speed scanner, where the retina is subjected to a slower moving laser spot, which can cause discomfort or harm to a patient.

Another field of application is the field of laser radar, wherein a laser beam is used as a radar beam. For the detection of objects that move at high speed, such as missiles, it is desirable to have the shortest possible time between two successive intersections of the interrogating beam and the moving object. Therefore here a high speed laserscanner is also useful in such an application.

Such techniques cannot easily be implemented into a format in which a rotating mirror construction is fabricated in a set of fabrication methods commonly referred to a MEMS techniques. MEMS is an acronym standing for Micro Electro Mechanical Systems. In MEMS technology the techniques of integrated circuit technologies are applied for the fabrication of mechanical systems.

The current invention relates to the field of fabricating a rotatable mirror contruction using MEMS techniques. Within the field of rotatable MEMS mirrors systems a unique position is taken by piezoelectrically actuated mirror systems such as the so-called double "J" system by Smits et al. See Reference [1]

Workings further with the possible applications of piezoelectric benders, we discovered new constructions, which were the subject of a previous application. See Reference [2].

Continuing these detailed investigations we discovered another useful device that is the subject of this current application.

The difference between the device in this current application and the device that is described in U.S. Pat. No. 7,005,781, is that the current devices uses very wide bending elements, much wider than would be allowed under the common assumption that states that the behavior of cantilever beams can be calculated using the Euler-Bernoulli equation if they are "long and slender".

Therefore the behavior of the device in the current application cannot be calculated analytically, but only by numerical methods, such as the Finite Elements Analysis method. As it was possible to calculate the behavior of the previous device by analytical means, whereas it is impossible to do so with the current device, because the boundary conditions do not allow us to do this, the current device is not identical to prior art, and could not be foreseen by anyone sufficiently well acquainted with the prior art.

3 DESCRIPTION OF THE CURRENT INVENTION

To elucidate the construction of the current inventions, we refer to the paper by Smits et al. (Constituent Equations of Piezoelectric Bimorphs, J. G. Smits, S. I. Dalke and T. K. Cooney, Sensors and Actuators, Vol. 28 pp. 41-61, 1991.) In this paper the relations between tip deflection $\delta$ and tip angle $\alpha$ of a piezoelectric bimorph have been defined. Here we use only a small part of the paper namely the part that gives the defining relation between moment M, voltage V, and the tip deflection $\delta$ and tip angle $\alpha$ $$\begin{pmatrix} \alpha \\ \delta \end{pmatrix} = \begin{pmatrix} b_{11} & b_{14} \\ b_{41} & b_{44} \end{pmatrix} = \begin{pmatrix} M \\ V \end{pmatrix} \qquad (1)$$

The relation between $\alpha$ and $\delta$ is given as:

$$\alpha = \frac{2\delta}{L},$$

where L is the length of the piezoelectric bender.

We use the term bender here to indicate an element such as a plate or beam that bends under the application of an external stimulus. By this definition, a piezoelectric bimorph under the stimulus of a voltage is a bender but a bimetallic element under the stimulus of a temperature change is also a bender.

The matrix elements $b_{ij}$ are given in the above named reference.

4 A ROTATIONAL UNIT

We consider a particular construction, consisting of two benders, namely, of a first bender of a predetermined length L and width w, attached on the first end and free on the second end, a second bender with a length of approximately four-tenth of the predetermined length (0.4 L) which is attached with its first end to the second or free end of the first bender, while the second or free end of the second bender is attached to the rotation axis of a mirror.

The exact value of the length of the second bender will be described hereafter, as it will suffice for the general geometrical description of the device, to say that the second bender is approximately four-tenth of the length of the first bender.

An identical unit consisting of two benders, one of which having the single predetermined length and the other having a length of four-tenth of the predetermined length, mirrored around a symmetry line through the center of the mirror is used to complement the original set of two benders, to form a symmetric rotational unit.

5 DESCRIPTION OF THE OPERATION

We refer to FIG. 1, where a top view of a high speed scanner is given, and FIG. 2, which shows a side view.

On the left side in FIG. 1 a first bender 101 is shown, with a first end 102 on its lower side. This first end is clamped and immobile. On the other end of the first bender, the second end 103 the first bender is mainly free, but it is attached on its side to an attachment piece 104 which in turn is connected to a second bender 105, on its first end 106. The second end of the second bender, 107, rotates with the bending of the second bender, while it is connected to a second attachment piece 109.

Both benders are fabricated in the same multilayer piezoelectric thin film MEMS process, and have identical properties in the thickness direction. When powered by the same voltage, they will have the same radius of curvature.

Electrical connections to the first and second bender are such that when the first bender bends upward, making it concave, the second bender bends downward, making it convex, but both having the same absolute value of the curvature.

This second bender has a first end that is connected to the attachment piece 104, and a second end that forms the axis of rotation 108 of the rotated element.

When the first bender bends, its first end being clamped and immobile, its free second end can move in and out of the plane of the drawing.

In doing so the first end of the second bender moves along with the second end of the first bender, as both are rigidly attached to each other, through the attachment piece 104.

The convex shape of the second bender and the subsequent different angular spatial orientation of the first and second end of the second bender result in an addition of the angular displacements of the two benders, such that the total angular displacement between the first end of the first bender and the second end of the second bender, is the sum of the angular displacements of the ends of the first and second benders.

The length of the second bender is less than half of that of the first bender, its length being chosen such that the second end of the second bender precisely touches the baseline 112, as shown in FIG. 2, which marks the place where the whole set of two benders with its optical elements between them will come to rest if the driving force that bends the benders, is removed.

When this system is driven by a sinusoidal voltage, this combination of choices for lengths of these benders, ensures that during the entire period the second end of the second bender, and, with it, the axis of the optical element is immobile, but it does undergo a rotation.

As long as the motion of the bending elements can be adequately described by the relation between an external moment and the resulting curvature as in the Euler Bernoulli Equation with a fourth order derivative, but without the complications of the Timoshenko beam theory, the second end remains touching the baseline, regardless of the moment of time during in the sinusoidal motion.

This latter fact is illustrated in FIG. 2.

Here the first bender 101 is shown in profile. At its clamped point 102, a horizontal dashed line 112 represents the baseline, the reference line from which deflections are measured.

The tangent 113 to the tip 103 of first bender 101 intersects the baseline exactly at the point of half of the length of the first bender, the intersecting angle $\alpha$ being equal to the arctan $$\frac{2\delta}{L},$$

in which L is the length of the first bender and $\delta$ its tip deflection. Thereby the clamping point of the second bender has been rotated over the angle $\alpha$, rotating all bodies subsequently attached to this second bender.

Accordingly the tangent 114 to the tip of the second bender, is rotated over this angle $\alpha$, to which the own rotation due to the curvature of the second bender is added. As this second bender is not as long as the first bender its added angle is not as large as $\alpha$, but somewhat smaller crucial point in the design is that the length of the second bender is chosen such that the tip 107 of the second bender is exactly located at the baseline 112, at the moment in time of its largest deflection away from the baseline of this second bender which is now, of course, the tangent 113 to the tip of the first bender.

By way of a numerical example, it can be stated as an illustration, that is not meant to limit the scope of this application in any way, that in the case that the if the tip deflection of the first bender is one hundredth of its length, ($\delta$=0.014 the tip rotation $\alpha$ is 0.02 radians, and the slope of the tangent 114 is 0.033 radians. The correct length of the second bender in this example is 0.42 L.

This is a first clear distinction between the current device and the device from U.S. Pat. No. 7,005,781, as the latter device has no such construction.

This design enables one to operate this scanning system with a sinusoidal voltage, whereby the first bender and the second bender undergo rotations and translations over their entire lengths, but the tip of the second bender 107, will at any moment in time during the sinusoidal excitation be fixed in its initial location at the baseline 112.

Thus, this tip 107 of the second bender undergoes rotation without translation. A large object such as drawn in FIG. 1 as object 111, which could be a optical object, such as a mirror, prism or grating, being rigidly attached through attachment piece 109 will then undergo rotation without translation.

The rotation incurred by object 111 will be the sum of the tip rotation of the first bender and the rotation of the second bender at the intersection of tangent 114 and baseline 112. This latter angle is a little less than $\alpha/2$. As not the maximization of the angle was intended, but the precise location of the tip 107 at the baseline 112, this is satisfactory. The total angle between the tangent 114 at tip of the second bender and the baseline 112 is therefore approximately $1.5\alpha$.

By this construction it has been achieved that the axis of the object 111 rotates without translation.

In practical applications, the object 111 may have a considerable rotational inertia with respect to its axis of rotation 108, and therefore, a considerable sinusoidal driving moment may be required, to move this object in a sinusoidal rotational motion. The driving moment $M_d$ that a simple symmetrical piezoelectric bimorph can exert is equal to $M_d = d_{31} wh/2s_{11}^E$, in which $d_{31}$ is the piezoelectric coefficient, w is the width, h is the thickness of the individual piezoelectric elements that form the bimorph, and $s_{11}^E$ is the elastic modulus. It is clear that the exerted moment $M_d$ is linearly proportional to the width w of the bending element.

In order to increase the resonance frequency to the highest possible value, the bending elements have to be as wide as possible.

This makes it impossible to calculate their behavior analytically using the Euler Bernoulli equation, which required that the benders are "long and slender", which the benders of this application are not. On the contrary they are short and wide.

This therefore is the second distinction with the device mentioned in U.S. Pat. No. 7,005,781.

This large width is shown in FIG. 1, where the second bender is drawn approximately just as wide as it is long. Given a certain area in which the device has to be fabricated, a designer can use the available space, maximizing the width of the first and second bender, while keeping the length of the second bender at just under half that of the first bender.

Now these bending elements have a ratio of length L and width w which is much closer to unity than is the case for normal piezoelectric bimorphs, and therefore they look more like bending plates, which would deform to a spherical surface, rather than like bending beams which deform to a cylindrical surface.

To avoid that the benders bend like plates instead of beams, which would create a bending moment perpendicular to the rotational axis, and which would translate the optical element 111, out of the plane of the drawing, and additionally would exert a bending moment on it, an electrode pattern consisting of stripes in the longitudinal direction is used.

6 REFERENCES

Figure 1:
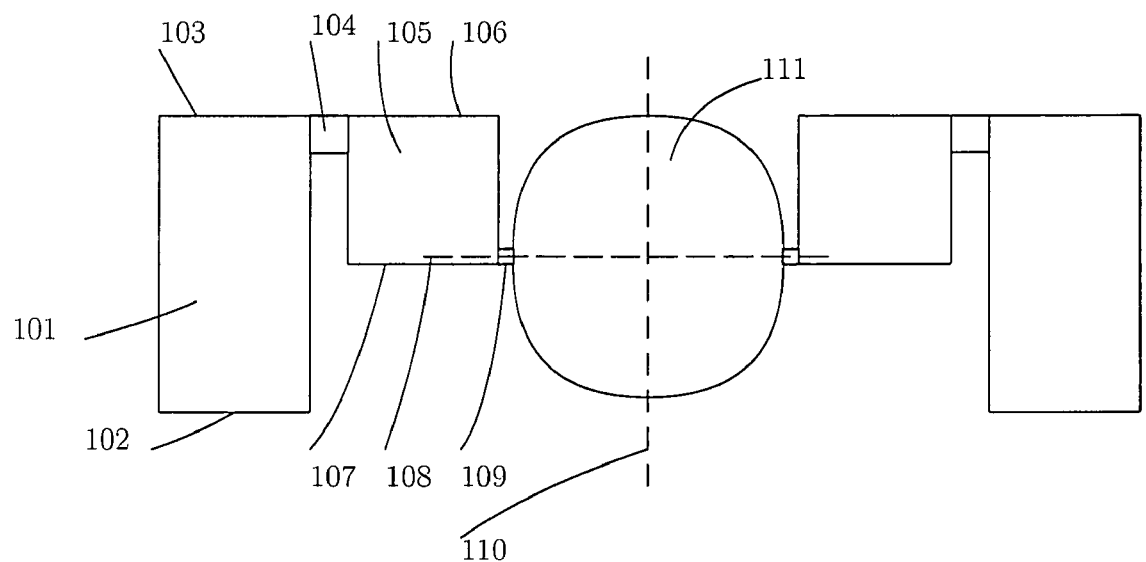
FIG. 1 is a top view of a high speed scanner
Figure 2:
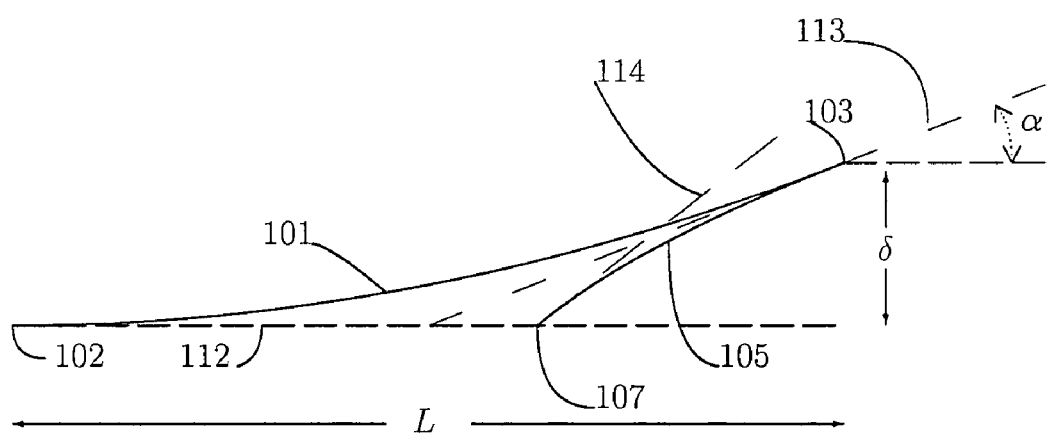
FIG. 2 is a side view of a high speed scanner

1. J. G. Smits, D. C. Brown, GSILumonics, Bedford Mass., K. Fujimoto, V. K. Kleptsyn, Boston University, Boston, Mass., S. E. Vargo, D. V. Wiberg, Jet Propulsion Laboratory, Pasadena, Calif., J. T. Evans, G. Z. Velasquez Radiant Technologies, Albuquerque, N. Mex., *Dynamic and Static Behavior of Piezoelectric Bimorphs with Extenders in Optical Scanners*, Proceedings IEEE Ultrasonics Symposium 2000, San Juan, Puerto Rico Vol 2 pp 1093-1096.
2. J. G. Smits, Devices for rotation using piezoelectric benders, U.S. Pat. No. 7,005,781, issued 28 Feb. 2006.

What is claimed is:

1. A symmetrical construction, consisting of two halves, of which each half consists of
   (a) a first bender of a predetermined length with a predetermined curvature, with a first end and a second end, of which the first end is rigidly clamped and the second end is free to move, whereas connected laterally to the second end of the first bender is
   (b) a second bender which has the opposite curvature of the first bender,
      and which has a length which is a precise fraction of the predetermined length of the first bender,
      and which has a first end connected to the second end of the first bender,
      and a second end, which is connected to
   (c) an attachment piece, which is located at the free end of the second bender.
2. The symmetrical construction of claim 1 whereby each of the two halves are attached through an attachment piece to a central element, which is supported by and according to the function of the device, rotated by both halves.
3. The symmetrical construction of claim 1, in which the second bender is shorter than half of the first bender, having as its length the precise particular fraction of the length of the first bender, that will cause that when the device is in normal operation, the free tip of the second bender is always, regardless of the moment in time during a sinusoidal motion, exactly at a point where no translation occurs, but only translation.
4. The symmetrical construction of claim 2 in which the central element is an element used for optical purposes.
5. The symmetrical construction of claim 1 wherein each of the first bender and the second bender are made with longitudinal slots to prevent plate bending modes from being excited.
6. The symmetrical construction of the previous claims in which the first bender and second bender are made of piezoelectric bimorphs.
7. The symmetrical construction of any one of claims 1 through 5 in which the first bender and second bender are made of a nonpiezoelectric substrate on which a piezoelectric film is located.
8. The symmetrical construction of any one of claims 1 through 5 in which the first bender and the second bender are made using piezomagnetic materials.
9. The symmetrical construction of any one of claims 1 through 5 in which the first bender and the second bender are made using electrostrictive materials.
10. The symmetrical construction of any one of claims 1 through 5 in which the first bender and the second bender are made using magnetostrictive materials.

\* \* \* \* \*